(12) United States Patent
Kim et al.

(10) Patent No.: US 9,969,893 B2
(45) Date of Patent: May 15, 2018

(54) AQUEOUS COMPOSITIONS, METHODS OF PRODUCING CONDUCTIVE THIN FILMS USING THE SAME, CONDUCTIVE THIN FILMS PRODUCED THEREBY, AND ELECTRONIC DEVICES INCLUDING THE SAME

(71) Applicants: SAMSUNG ELECTRONICS CO., LTD., Suwon-si, Gyeonggi-do (KR); Research & Business Foundation SUNGKYUNKWAN UNIVERSITY, Suwon-si, Gyeonggi-do (KR)

(72) Inventors: Kwang Hee Kim, Seoul (KR); Daejin Yang, Yeongju-si (KR); Jong Wook Roh, Anyang-si (KR); Rujun Ma, Suwon-si (KR); Hyeon Cheol Park, Hwaseong-si (KR); Seung-Hyun Baik, Suwon-si (KR); Jae-Young Choi, Suwon-si (KR)

(73) Assignees: SAMSUNG ELECTRONICS CO., LTD., Gyeonggi-Do (KR); RESEARCH & BUSINESS FOUNDATION SUNGKYUNKWAN UNIVERSITY, Gyeonggi-Do (KR)

( * ) Notice: Subject to any disclaimer, the term of this patent is extended or adjusted under 35 U.S.C. 154(b) by 28 days.

(21) Appl. No.: 14/836,146

(22) Filed: Aug. 26, 2015

(65) Prior Publication Data
US 2016/0060468 A1 Mar. 3, 2016

(30) Foreign Application Priority Data
Aug. 26, 2014 (KR) .................. 10-2014-0111706

(51) Int. Cl.
*H01B 1/02* (2006.01)
*C09D 5/24* (2006.01)
*H01L 31/0224* (2006.01)

(52) U.S. Cl.
CPC .............. *C09D 5/24* (2013.01); *H01B 1/02* (2013.01); *H01L 31/0224* (2013.01); *H01L 31/022466* (2013.01); *H01L 31/022491* (2013.01)

(58) Field of Classification Search
CPC .......... C09D 5/24; H01B 1/02; H01L 31/0224; H01L 31/1884; H01L 51/442;
(Continued)

(56) References Cited

U.S. PATENT DOCUMENTS 8,623,242 B2 1/2014 Jiang et al.
2009/0146113 A1* 6/2009 Toyoda ................ C09D 11/326
252/512

(Continued)

FOREIGN PATENT DOCUMENTS

| JP | 2006070300 A | 3/2006 |
| JP | 2009094033 A | 4/2009 |
| KR | 1020130021170 A | 3/2013 |

OTHER PUBLICATIONS

Erik C. Garnett, et al.; "Self-limited plasmonic welding of silver nanowire junctions", Nature Materials, vol. 11, Mar. 2012, pp. 241-249.

(Continued)

*Primary Examiner* — Mark Kopec
*Assistant Examiner* — Jason P Thomas
(74) *Attorney, Agent, or Firm* — Cantor Colburn LLP

(57) ABSTRACT

An aqueous composition including: a conductive metal nanoparticle having an organic compound disposed on a surface of the conductive metal nanoparticle; a conductive (Continued)

metal nanowire; and a solvent including water and optionally an alcohol.

22 Claims, 8 Drawing Sheets

(58) Field of Classification Search
CPC ..... H01L 31/022466; H01L 31/022491; B22F 1/0025; B22F 1/0044; Y10T 428/24364
See application file for complete search history.

(56) References Cited

U.S. PATENT DOCUMENTS

| | | | |
|---|---|---|---|
| 2010/0227189 A1* | 9/2010 | Shumaker-Parry ... | B22F 1/0022 428/570 |
| 2011/0281070 A1 | 11/2011 | Mittal et al. | |
| 2012/0104325 A1* | 5/2012 | Talapin ............... | B82Y 30/00 252/502 |
| 2012/0292725 A1 | 11/2012 | Christoforo et al. | |
| 2014/0356524 A1* | 12/2014 | Gao ..................... | H01B 1/02 427/126.1 |

OTHER PUBLICATIONS

Oleg A Yeshchenko, et al.; "Surface plasmon as a probe for melting of silver nanoparticles", Nanotechnology 21 (2010) 045203 (6pp).
Sally D. Solomon, et al.; "Synthesis and Study of Silver Nanoparticles", Journal of Chemical Education, vol. 84. No. 2, Feb. 2007, pp. 322-325.
Siwei Zhu et al.; "Transferable self-welding silver nanowire network as high performance transparent flexible electrode", Nanotechnology 24 (2013) 335202 (7pp).
Tahmina Akter et al.; "Reversibly Stretchable Transparent Conductive Coatings of Spray-Deposited Silver Nanowires", Applied Materials & Interfaces 2012, 4(4), pp. 1855-1859.

* cited by examiner

Prior to the heat-treating

After the heat-treating
(183°C and 10 minutes)

FIG. 6

| Window |
|---|
| Optically clear adhesive layer |
| Transparent electrically conductive film |
| Optically clear adhesive layer |
| Transparent electrically conductive film |
| Display panel | ic device like a flat panel display such as an LCD or LED, a touch screen panel, a solar cell, and a transparent transistor, includes an electrically conductive thin film or a transparent electrically conductive thin film. A material for an electrically conductive thin film may be required to have, for example, high light transmittance of greater than or equal to about 80% and low specific resistance of less than or equal to about 100 microohm centimeters (μΩ*cm) in a visible light region. These materials may be applied to various arts depending on a sheet resistance value range. For example, a material having sheet resistance of greater than or equal to about 300 ohms per square (ohm/sq) is desirable for use in an antistatic film or an electrode for a touch screen panel. A material having sheet resistance of about 20 to about 50 ohm/sq is desirable for use in a transparent electrode for a display such as a flexible display or E-paper, and a material having sheet resistance of less than or equal to about 10 ohm/sq is desirable for use in a solar cell and an LED electrode.

AQUEOUS COMPOSITIONS, METHODS OF PRODUCING CONDUCTIVE THIN FILMS USING THE SAME, CONDUCTIVE THIN FILMS PRODUCED THEREBY, AND ELECTRONIC DEVICES INCLUDING THE SAME

CROSS-REFERENCE TO RELATED APPLICATION

This application claims priority to and the benefit of Korean Patent Application No. 10-2014-0111706 filed in the Korean Intellectual Property Office on Aug. 26, 2015, the entire contents of which are incorporated herein by reference.

BACKGROUND

1. Field

An aqueous composition, a method of producing a conductive thin film using the same, a conductive thin film produced therefrom, and an electronic device including the same are disclosed.

2. Description of the Related Art

An electronic device like a flat panel display such as an LCD or LED, a touch screen panel, a solar cell, and a transparent transistor, includes an electrically conductive thin film or a transparent electrically conductive thin film. A material for an electrically conductive thin film may be required to have, for example, high light transmittance of greater than or equal to about 80% and low specific resistance of less than or equal to about 100 microohm centimeters ($\mu\Omega$*cm) in a visible light region. These materials may be applied to various arts depending on a sheet resistance value range. For example, a material having sheet resistance of greater than or equal to about 300 ohms per square (ohm/sq) is desirable for use in an antistatic film or an electrode for a touch screen panel. A material having sheet resistance of about 20 to about 50 ohm/sq is desirable for use in a transparent electrode for a display such as a flexible display or E-paper, and a material having sheet resistance of less than or equal to about 10 ohm/sq is desirable for use in a solar cell and an LED electrode.

The currently-used transparent electrode material may include indium tin oxide (ITO), tin oxide ($SnO_2$), zinc oxide (ZnO), and the like. The ITO is an n-type semiconductor that produces oxygen vacancy and electrons by $SnO_2$, and electrical and optical properties of the ITO are determined by vacancies in a crystalline $In_2O_3$ structure. The ITO has satisfactory transmittance in a full visible light range, and shows sheet resistance of greater than or equal to 100 ohm/sq when deposited at room temperature. However, the ITO has insufficient flexibility and is expensive due to limited indium reserves. Therefore, there is a need for f a flexible transparent electrode material having low sheet resistance as well as high transmittance is needed, which could substitute ITO.

SUMMARY

An embodiment provides an aqueous composition that may produce a flexible conductive thin film having high conductivity and excellent light transmittance.

Another embodiment provides a method of producing a conductive thin film from the aqueous composition, and a conductive thin film produced therefrom.

Yet another embodiment provides an electronic device including the conductive thin film.

In an embodiment, an aqueous composition includes:
a conductive metal nanoparticle having an organic compound disposed on a surface of the conductive metal nanoparticle;
a conductive metal nanowire; and
a solvent including water and optionally an alcohol.

The conductive metal nanoparticle may have an average particle diameter of less than or equal to about 5 nanometers. The conductive metal nanowire may have a diameter of less than or equal to about 50 nanometers.

The conductive metal nanowire may have a diameter of less than or equal to about 30 nanometers, and the particle diameter of the metal nanoparticle may be less than that of the conductive metal nanowire.

The conductive metal nanowire may have a length of greater than or equal to about 10 micrometers. The conductive metal nanowire may have a length of greater than or equal to about 15 micrometers.

The conductive metal nanoparticle may include silver, gold, aluminum, copper, tin, palladium, platinum, tungsten, molybdenum, or a combination thereof.

The conductive metal nanowire may include silver, copper, gold, aluminum, cobalt, palladium, or a combination thereof.

The conductive metal nanoparticle and the conductive metal nanowire may include the same metal.

The organic compound may include a C2 to C30 thiol compound, a C2 to C30 carboxylic acid compound, a C2 to C30 amine compound, or a combination thereof.

The organic compound may include a C2 to C30 aliphatic thiol, a C6 to C30 aromatic thiol, or a combination thereof.

The organic compound may further include a hydrophilic functional group selected from an amine group, an ammonium salt group, a carboxylic acid group or a salt thereof, and a hydroxy group.

The conductive metal nanoparticle may be included in an amount of about 1 to about 50 parts by weight per 100 parts by weight of the conductive metal nanowire.

The organic compound disposed on a surface of the conductive metal nanoparticle may be included in an amount of less than or equal to about 50% based on the total weight of the conductive metal nanoparticle.

The alcohol may have about 1 to about 10 carbon atoms and about 1 to about 6 hydroxy groups. The alcohol may be a polyhydric alcohol having 4 hydroxy groups, a polyhydric alcohol having 5 hydroxy groups, or a polyhydric alcohol having 6 hydroxy groups. The alcohol may include methanol, ethanol, n-propyl alcohol, isopropyl alcohol, n-butanol, isobutanol, t-butanol, ethylene glycol, propylene glycol, propylene glycol methyl ether, or a combination thereof.

In another embodiment, a method of producing a conductive thin film includes:
obtaining an aqueous dispersion including a binder and a conductive metal nanowire having a diameter of less than or equal to about 50 nanometers;
mixing the aqueous dispersion with a conductive metal nanoparticle having an organic compound disposed on a surface of the conductive metal nanoparticle, wherein an average conductive metal nanoparticle diameter is less than or equal to about 5 nanometers to obtain an aqueous composition;
coating the aqueous composition on a substrate, and optionally drying the same to obtain a film; and
heat-treating the film at a temperature of greater than or equal to about 80° C. and less than or equal to about 190°

C., to prepare a conductive thin film including at least two nanowires welded by the conductive metal nanoparticle.

The conductive metal nanoparticle may include silver, gold, aluminum, copper, tin, palladium, platinum, tungsten, molybdenum, or a combination thereof.

The conductive metal nanowire may include silver, copper, gold, aluminum, cobalt, palladium, or a combination thereof.

The organic compound may include a C2 to C30 thiol compound, a C2 to C30 carboxylic acid compound, a C2 to C30 amine compound, or a combination thereof.

In yet another embodiment, a conductive thin film includes at least two conductive metal nanowires welded by at least a portion of a conductive metal nanoparticle having an organic compound disposed on a surface and an average particle diameter of less than or equal to about 5 nanometers.

The conductive metal nanowire may have a diameter of less than or equal to about 50 nanometers.

The conductive metal nanoparticle may include silver, gold, aluminum, copper, tin, palladium, platinum, tungsten, molybdenum, or a combination thereof.

The conductive metal nanowire may include silver, copper, gold, aluminum, cobalt, palladium, or a combination thereof.

The conductive metal nanoparticle and the conductive metal nanowire may include the same metal.

The organic compound may include a C2 to C30 thiol compound, a C2 to C30 carboxylic acid compound, a C2 to C30 amine compound, or a combination thereof.

The conductive thin film may further include an overcoating layer including a thermosetting resin, an ultraviolet curable resin, or a combination thereof on the surface of the thin film.

The conductive thin film may have sheet resistance of less than or equal to about 50 ohm/sq, for example, less than or equal to about 40 ohm/sq, and transmittance of greater than or equal to 90% in a full visible light range of 380 to 780 nanometers) at haze of less than or equal to about 1.0% measured by a haze meter.

In still another embodiment, an electronic device includes the above conductive thin film is provided.

The electronic device may be a flat panel or curved surface display, a touch screen panel, a solar cell, an e-window, an electrochromic mirror, a transparent heater, a heat mirror, a transparent transistor, a transparent strain sensor, or a flexible display.

BRIEF DESCRIPTION OF THE DRAWINGS

The above and other aspects, advantages and features of this disclosure will become more apparent by describing in further detail exemplary embodiments thereof with reference to the accompanying drawings, in which:

FIG. 6 is a schematic cross-sectional view of an electronic device according to another non-limiting embodiment.

DETAILED DESCRIPTION

Figure 1:
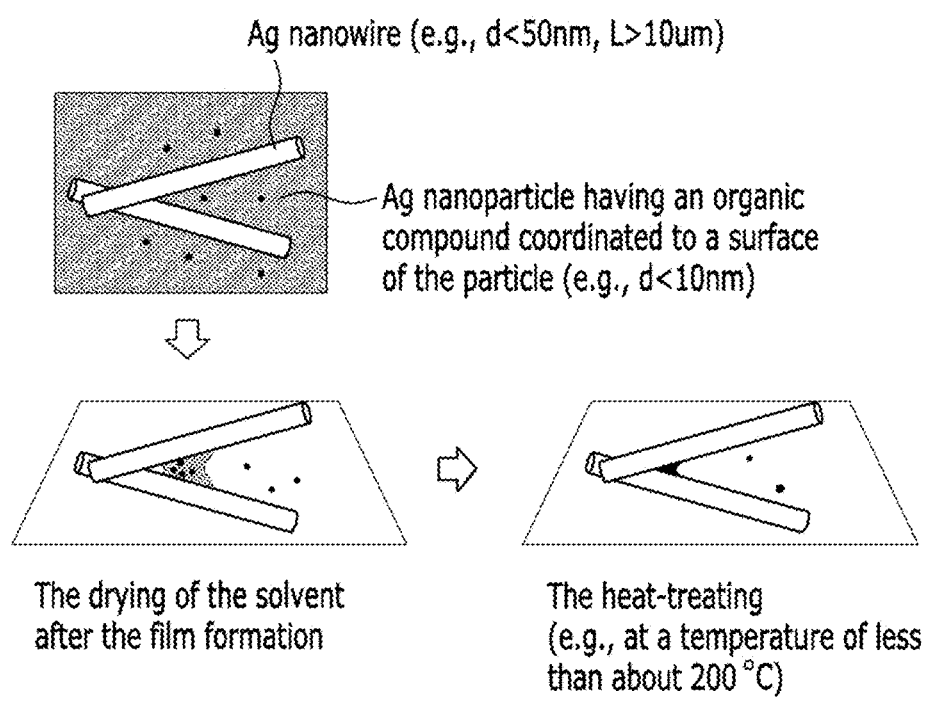
FIG. 1 is a schematic view showing a production process of an aqueous composition according to an embodiment and a conductive thin film produced therefrom.

This disclosure will be described more fully hereinafter in the following detailed description, in which some but not all embodiments of this disclosure are described. This disclosure may be embodied in many different forms and is not be construed as limited to the embodiments set forth herein. Rather, these embodiments are provided so that this disclosure would fully convey the scope of the inventive concept to those skilled in the art. Thus, in some exemplary embodiments, well-known technologies are not specifically explained to avoid ambiguous understanding of the present inventive concept. Accordingly, the exemplary embodiments are merely described below, by referring to the figures, to explain aspects of the present inventive concept. Expressions such as "at least one of," when preceding a list of elements, modify the entire list of elements and do not modify the individual elements of the list. Unless otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted. In addition, unless explicitly described to the contrary, the word "comprise" and variations such as "comprises" or "comprising" and the word "include" and variations such as "includes" or "including", when used in this specification, will be understood to imply the inclusion of stated elements but not the exclusion of any other elements.

Unless specifically described to the contrary, a singular form includes a plural form.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

In the drawings, the thickness of layers, films, panels, regions, etc., are exaggerated for clarity. Like reference numerals designate like elements throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, parts having no relationship with the description are omitted for clarity of the embodiments, and the same or similar constituent elements are indicated by the same reference numerals throughout the specification.

An aqueous composition according to an embodiment includes:

a conductive metal nanoparticle having an organic compound disposed on a surface of the conductive metal nanoparticle, a conductive metal nanowire, and a solvent including water and optionally an alcohol.

The conductive metal nanoparticle may have an average particle diameter of less than about 10 nanometers (nm), for example less than or equal to about 5 nm, or less than or equal to about 3 nm. The conductive metal nanowire may have a diameter of less than or equal to about 50 nm, for example less than or equal to about 40 nm, or less than or equal to about 30 nm. As used herein, the term "nanowire" refers to a wire having a nano-sized diameter, and an aspect ratio of greater than or equal to about 100, for example, greater than or equal to about 200. The conductive metal nanowire may have a diameter of less than or equal to about 30 nm, and the metal nanoparticles may have a particle size of less than the diameter of the conductive metal nanowire. The length of the conductive metal nanowire is not particularly limited, and may vary with a diameter thereof. For example, the length may be greater than or equal to about 1 micrometers (μm), greater than or equal to about 2 μm, greater than or equal to about 3 μm, greater than or equal to about 4 μm, or greater than or equal to about 5 μm, but is not limited thereto. In another embodiment, the conductive metal nanowire may have a length of greater than or equal to about 10 μm, for example, greater than or equal to about 11 μm, greater than or equal to about 12 μm, greater than or equal to about 13 μm, greater than or equal to about 14 μm, or greater than or equal to about 15 μm.

The conductive metal nanoparticle may include silver (Ag), gold (Au), aluminum (Al), copper (Cu), tin (Sn), palladium (Pd), platinum (Pt), tungsten (W), molybdenum (Mo), or a combination thereof (e.g., an alloy thereof, nanoparticles having a core-shell structure, and the like). The nanoparticles may have any shape (e.g., spherical, polyhedral, and the like), without limitation. For example, the conductive metal nanoparticles may be silver-containing nanoparticles, copper-containing nanoparticles, gold-containing nanoparticles, and the like. The conductive metal nanoparticles may be produced by a known method, or may be commercially available.

The conductive metal nanowire may include silver (Ag), copper (Cu), gold (Au), aluminum (Al), cobalt (Co), palladium (Pd), or a combination thereof (e.g., an alloy thereof, or a nanometal wire having at least two segments). The conductive metal nanowire may be produced by a known method, or may be commercially available. The nanowire may include a polymer coating of polyvinylpyrrolidone and the like on the surface thereof. The conductive metal nanoparticles and the conductive metal nanowire may include the same metal.

The conductive metal nanoparticle includes an organic compound coordinated on its surface. The organic compound coordinated to the surface of the nanoparticle is different from an organic compound that is simply mixed with the nanoparticle in the composition. For example, the organic compound coordinated to the surface of the nanoparticles effectively controls a size of nanoparticles produced by a liquid-phase reduction method, which is less than about 10 nm. The amount of the coordinated organic compound may be controlled in order for a fine conductive nanoparticles of less than or equal to about 5 nm to be stably dispersed in a solvent. Without wishing to be bound by any particular theory, the organic compound is volatilized at a temperature of lower than the boiling temperature thereof from the surface of the nanoparticles, and thereby welding of the nanowire by the conductive nanoparticles may be enabled. The organic compound coordinated to the surface may be the organic compound used in the production process of the nanoparticles. In another embodiment, the organic compound coordinated to the surface may be introduced by surface modification of the nanoparticles.

The organic compound may include a C2 to C30 thiol compound, a C2 to C30 carboxylic acid compound, a C2 to C30 amine compound, or a combination thereof. In an embodiment, the organic compound may include a C2 to C30 aliphatic thiol (e.g., alkylthiol), a C6 to C30 aromatic thiol (e.g., benzyl mercaptane), or a combination thereof. The organic compound may further include a hydrophilic functional group selected from an amine group, an ammonium salt group, a carboxylic acid group or a salt thereof, and a hydroxy group. Examples of the organic compound may include, but are not limited to cysteamine and the like. The amount of the organic compound disposed on the surface of the conductive metal nanoparticle may be less than or equal to about 50%, less than or equal to about 30%, or less than or equal to about 15% based on the total weight of the conductive nanoparticles. In some embodiments, the organic compound may surround the surface of the conductive metal nanoparticle.

In the aqueous composition, the amount of the metal nanowire is not particularly limited, and may be appropriately selected in order to achieve desirable sheet resistance and light transmittance. In an embodiment, the aqueous composition may include the metal nanowire in an amount of less than or equal to about 0.5 percent by weight (wt %), for example, less than or equal to about 0.3 wt %, or less than or equal to about 0.1 wt % based on the total weight of the composition, without limitation. In an embodiment, the aqueous composition may include the metal nanowire in an amount of greater than or equal to about 0.01 wt %, for example, greater than or equal to about 0.03 wt %, or greater than or equal to about 0.05 wt %, but it is not limited thereto.

The amount of the conductive nanoparticles may be greater than or equal to about 1 part by weight, for example, greater than or equal to about 2 parts by weight, greater than or equal to about 3 parts by weight, greater than or equal to about 4 parts by weight, or greater than or equal to about 5 parts by weight per 100 parts by weight of the conductive metal nanowire. The amount of the conductive nanoparticles may be less than or equal to about 50 parts by weight, for example, less than or equal to about 40 parts by weight, less than or equal to about 35 parts by weight, less than or equal to about 30 parts by weight, or less than or equal to about 25 parts by weight per 100 parts by weight of the conductive metal nanowire. Within the above amount ranges, much lower sheet resistance and much higher transmittance of the conductive film may be embodied.

The composition includes water as a solvent. If desired, the composition may further include an alcohol as a solvent. The alcohol may have 1 to 10 carbon atoms and 1 to 6 hydroxy groups. The alcohol may include methanol, ethanol, n-propyl alcohol, isopropyl alcohol, n-butanol, isobutanol, t-butanol, propylene glycol, propylene glycol methyl ether, ethylene glycol, or a combination thereof. When coated with water alone as a solvent, a substrate such as a PET or PC substrate having a hydrophobic surface is not wetted well. When a small amount of ethanol is added, substrate wettability is improved and vapor generation is minimized. An amount of the alcohol relative to water may be appropriately adjusted. For example, the amount of the alcohol relative to water may be about 10 to about 50 parts by weight based on 100 parts by weight of water.

The aqueous composition may further include a binder. The binder may be any material that controls viscosity of the conductive ink composition and increases the binding properties of the metal nanostructure on the substrate. The binder is not particularly limited. The binder may be, for example, an organic binder, for example methyl cellulose, ethyl cellulose, hydroxypropyl methyl cellulose (HPMC), hydroxypropyl cellulose (HPC), xanthan gum, polyvinyl alcohol (PVA), polyvinyl pyrrolidone (PVP), carboxymethyl cellulose, hydroxyethyl cellulose, or a combination thereof, but is not limited thereto. The binder may be included in an amount of about 1 to about 100 parts by weight based on 100 parts by weight of the metal nanowire.

The aqueous composition may further include a polymer dispersing agent. The polymer dispersing agent may have a weight average molecular weight of less than or equal to about 40,000 Daltons, and may include, for example, a (meth)acrylate compound. The polymer as a dispersing agent may be included in an amount of about 0.1 to 5 parts by weight based on 100 parts by weight of the metal nanostructure.

In order to produce a flexible conductive thin film having high conductivity, various compositions including a conductive metal nanowire (e.g., silver nanowire) have been suggested. While the increased amount of the silver nanowire in the composition is required in order to obtain desirable sheet resistance, a high amount of a silver nanowire may not provide desirable light transmittance due to reflection characteristics of a metal itself. That is, in the case of a conductive film including a metal nanowire, the sheet resistance and light transmittance of the film have a trade-off relationship. Thus, it may be difficult to obtain a conductive film including a metal nanowire which simultaneously has low sheet resistance and high light transmittance (low haze).

On the other hand, the more contact points among nanowires a conductive film has, the higher conductivity the conductive film may show. However, there may be a problem of variation of the film resistance at the contact points when the film is under flexural deformation.

On the contrary, the aqueous composition of the aforementioned embodiments may provide a conductive film having high electrical conductivity (i.e., low sheet resistance) and high light transmittance (low haze) in accordance with the method described in detail hereinafter.

A method of producing a conductive thin film according to an embodiment includes:
preparing the aforementioned aqueous composition;
coating the aqueous composition on a substrate, and optionally drying the same to obtain a film; and
heat-treating the film at a temperature of greater than or equal to about 80° C. and less than or equal to about 190° C., to prepare a conductive thin film including at least two conductive metal nanowires welded by the conductive metal nanoparticles.

In another embodiment, the heat-treating may be performed in a roll-to-roll manner, or through photo-irradiation or infrared ray irradiation.

The preparation of the aqueous composition may include:
obtaining an aqueous dispersion including a conductive metal nanowire having a diameter of less than or equal to about 50 nm and optionally a binder; and
mixing the aqueous dispersion with conductive metal nanoparticles having an organic compound on the surface that is disposed on (or in some embodiments, surrounds) the surface (e.g., bonded with the surface by an ionic bond, a hydrogen bond, a Van der Waals bond, or a covalent bond) and having a particle diameter of less than about 10 nm, to obtain an aqueous composition.

Details of the conductive metal nanowire, the binder, and the conductive nanoparticles having the organic compound disposed on (or in some embodiments, surrounding) the surface are the same as described above. The nanoparticles having an average particle diameter of less than about 10 nm (e.g., average of less than or equal to about 5 nm) may be prepared by using an organic compound (e.g., a thiol organic compound) disposed on (or in some embodiments, surrounding) the surface. In particular, it is confirmed that a haze of the thin film may be significantly reduced in spite of reflection characteristics of the metal itself when the metal nanoparticles having such an organic compound at the surface are added to the composition.

The prepared aqueous composition is coated on the substrate to prepare a film. The substrate may include a glass substrate, a semiconductor substrate, a polymer substrate, or a combination thereof, and an insulation layer and/or a conductive film may be further stacked on the substrate. The conductive ink composition may be coated on the substrate using various methods, for example bar coating, blade coating, slot die coating, or a combination thereof. The film may be dried if necessary. The drying may be performed by any method (e.g., natural drying, heating, hot-air drying, and the like), without limitation. For example, the drying may be carried out at a temperature of less than or equal to about 130° C. (e.g., at 100° C. or lower) for a time period of less than or equal to about one hour (e.g., for 10 minutes or less). The film is heat-treated at a temperature of greater than or equal to about 80° C. and less than or equal to about 190° C., to prepare a conductive thin film including at least two nanowires welded by the conductive metal nanoparticles. The time for the heat treating is not particularly limited and may be selected appropriately (for example, in light of the concentration of the nanowires). For example, the heat-treating may be carried out at a temperature of about 170° C. to 190° C. for one minute to about 24 hours. For example, the heat-treating may be carried out at a temperature of about 180° C. for about 10 minutes to 30 minutes.

Referring to FIG. 1, when the composition is formed into a film and optionally dried, the metal nanoparticles dispersed in the composition may predominantly assemble at the junction of at least two nanowires, and when being heat-treated in such a state, welding at the junction of nanowires may occur due to agglomeration between nanowires and nanoparticles. Without wishing to be bound by any theory, when the nanoparticles having the characteristics in the composition are heat-treated, the nanowires are first melted and junction welding between the nanowires may occur at a much lower temperature (i.e., less than 200° C., for example, less than or equal to about 190° C., or less than or equal to about 180° C.). As a result, junction welding may occur with minimum of the side-effects that may be caused by the heat-treatment (e.g., nanowire agglomeration and breakage, damage to a substrate, or the like). In addition, such junction welding may allow an increase in continuity of nanowires and a decrease in contact resistance between nanowires. In addition, the contacts between the nanowires may be enhanced, and this may resolve the problem that the sheet resistance of the conductive film increases when the film is under flexural deformation.

The method of producing the conductive thin film using the composition may use a large area roll-to-roll process, and may provide a conductive thin film at high productivity and low cost.

The conductive thin film thus produced includes at least two conductive metal nanowires welded by at least a portion of a conductive metal nanoparticle having an organic compound disposed on (or in some embodiments, surrounding) the surface and an average particle diameter of less than about 10 nm.

The conductive thin film may further include an overcoating layer (OCL) including a thermosetting resin, an ultraviolet (UV) curable resin, or a combination thereof on the surface of the thin film. Specific examples of the thermosetting resin and ultraviolet (UV) curable resin for the OCL are known in the art. The method of forming the OCL from the materials is known in the art, and is not particularly limited.

The conductive thin film may have sheet resistance of less than or equal to about 50 ohms per square (ohm/sq), for example, less than or equal to about 40 ohm/sq, and transmittance of greater than or equal to 90% in a full visible light range of 380 nm to 780 nm) with haze of less than or equal to about 1.0% measured by a haze meter.

The thickness of the conductive thin film may be appropriately selected based on desirable sheet resistance and light transmittance. For example, the conductive thin film may have a thickness of about 10 to about 100 nm, but is not limited thereto.

The conductive thin film may be used for an electronic device such as a flat or curved panel display, a touch screen panel, a solar cell, an e-window, an electrochromic mirror, a transparent heater, a heat mirror, a transparent transistor, a transparent strain sensor, or a flexible display. The conductive thin film may be used for a functional glass or an antistatic film. Particularly, the conductive thin film may have improved flexibility, and may be applied to a flexible electronic device.

Hereinafter, an organic light emitting diode device including the conductive thin film as a transparent electrode is described referring to the drawings.

In the drawings, the thickness of layers, films, panels, regions, etc., are exaggerated for clarity. Similar reference numerals designate similar elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 5:
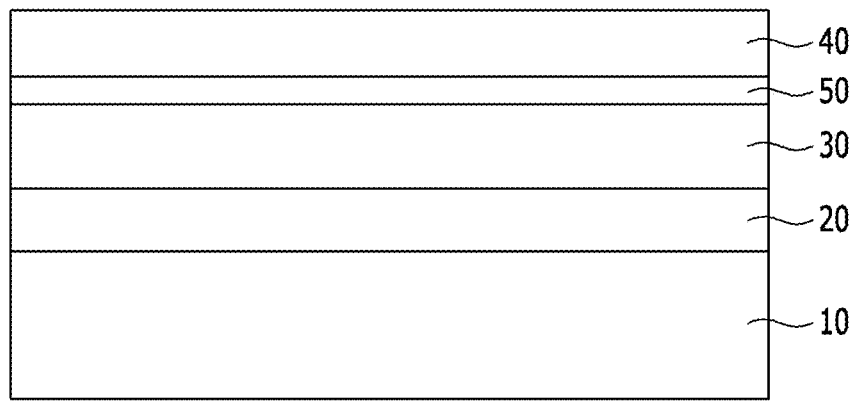
FIG. 5 is a schematic cross-sectional view of an electronic device according to one non-limiting embodiment.

FIG. 5 is a schematic cross-sectional view of an organic light emitting diode device according to an embodiment Referring to FIG. 5, an organic light emitting diode device according to an embodiment includes a substrate 10, a lower electrode 20, an upper electrode 40 facing the lower electrode 20, and an emission layer 30 interposed between the lower electrode 20 and the upper electrode 40.

The substrate 10 may be made of an inorganic material such as glass, or an organic material such as polycarbonate, polymethyl methacrylate, polyethylene terephthalate, polyethylene naphthalate, polyamide, polyethersulfone, or a combination thereof, or a silicon wafer.

One of the lower electrode 20 and the upper electrode 40 is a cathode and the other is an anode. For example, the lower electrode 20 may be an anode and the upper electrode 40 may be a cathode.

At least one of the lower electrode 20 and the upper electrode 40 may be a transparent electrode. When the lower electrode 20 is a transparent electrode, the organic light emitting diode device may have a bottom emission structure in which light is emitted toward the substrate 10, while when the upper electrode 40 is a transparent electrode, the organic light emitting diode device may have a top emission structure in which light is emitted away from the substrate 10. In addition, when the lower electrode 20 and the upper electrode 40 are both transparent electrodes, light may be emitted toward the substrate 10 and away from the substrate 10.

The transparent electrode is made of the aqueous composition. The emission layer 30 may be made of an organic material inherently emitting one among three primary colors such as red, green, blue, and the like, or a mixture of an inorganic material with the organic material, for example, a polyfluorene derivative, a (poly)paraphenylene vinylene derivative, a polyphenylene derivative, a polyvinylcarbazole, a polythiophene derivative, or a compound prepared by doping these polymer materials with a perylene pigment, a coumarin pigment, a rhodamine pigment, rubrene, perylene, 9,10-diphenylanthracene, tetraphenylbutadiene, Nile red, coumarin, quinacridone, and the like. An organic light emitting device displays a desirable image by a spatial combination of primary colors emitted by an emission layer therein.

The emission layer 30 may emit white light by combining basic colors such as three primary colors of red, green, and blue, and in this case, the color combination may emit white light by combining the colors of adjacent pixels or by combining colors laminated in a direction perpendicular to the substrate.

An auxiliary layer 50 may be positioned between the emission layer 30 and the upper electrode 40 to improve luminous efficiency of the emission layer 30. In the drawing, the auxiliary layer 50 is shown only between the emission layer 30 and the upper electrode 40, but it is not limited thereto. The auxiliary layer 50 may be positioned between the emission layer 30 and the lower electrode 20, or between the emission layer 30 and the upper electrode 40 and between the emission layer 30 and the lower electrode 20.

The auxiliary layer 50 may include an electron transport layer (ETL) and a hole transport layer (HTL) for balancing between electrons and holes, an electron injection layer (EIL), a hole injection layer (HIL) for reinforcing injection of electrons and holes, and the like. It may include one or more layers selected therefrom. The auxiliary layer 50 may be omitted.

In an exemplary embodiment, the electronic device may be a touch screen panel (TSP). The detailed structures of the touch screen panel are well known. The schematic structure of the touch screen panel is shown in FIG. 6. Referring to FIG. 6, the touch screen panel may include a first conductive film, a first transparent adhesive layer (e.g., an optically clear adhesive: OCA) film, a second conductive film, a second transparent adhesive layer, and a window for a display device on a panel for a display device (e.g., an LCD panel). The first conductive film and/or the second conductive film may be the above electrically conductive thin film.

In addition, an example of applying the conductive thin film to an organic light emitting diode device or a touch screen panel (e.g., a transparent electrode of TSP) is illustrated, but the conductive thin film may be used as an electrode for all electronic devices including a transparent electrode without a particular limit, for example, a pixel electrode and/or a common electrode for a liquid crystal display (LCD), an anode and/or a cathode for an organic light emitting diode device, and a display electrode for a plasma display device. In addition, the conductive thin film may be used for a functional glass or an antistatic film.

Hereinafter, the embodiments are illustrated in greater detail with reference to examples. However, the following exemplary embodiments are given only for exemplifying or describing the present inventive concept, and the range of the present inventive concept may not be limited thereto.

EXAMPLES

Preparation Example 1

Synthesis and Analysis of Silver (Ag) Nanoparticles Having Organic Compound (Thiol) Surrounding the Surface

[1] Silver nitrate is dissolved in 300 ml (milliliters) of ethanol, preparing a silver nitrate solution with a concentration of 0.02 moles per liter (mol/l). Then, 2.4 ml of an ethanol solution of benzyl mercaptane (concentration: 0.1 mol/l) is added to the silver nitrate solution, and the mixture is agitated at room temperature for 48 hours to synthesize silver nanoparticles. Referring to the transparent electron microscope image of the synthesized silver nanoparticles, it can be seen that the silver nanoparticles have an average particle diameter of approximately 5 nm.

Figure 7:
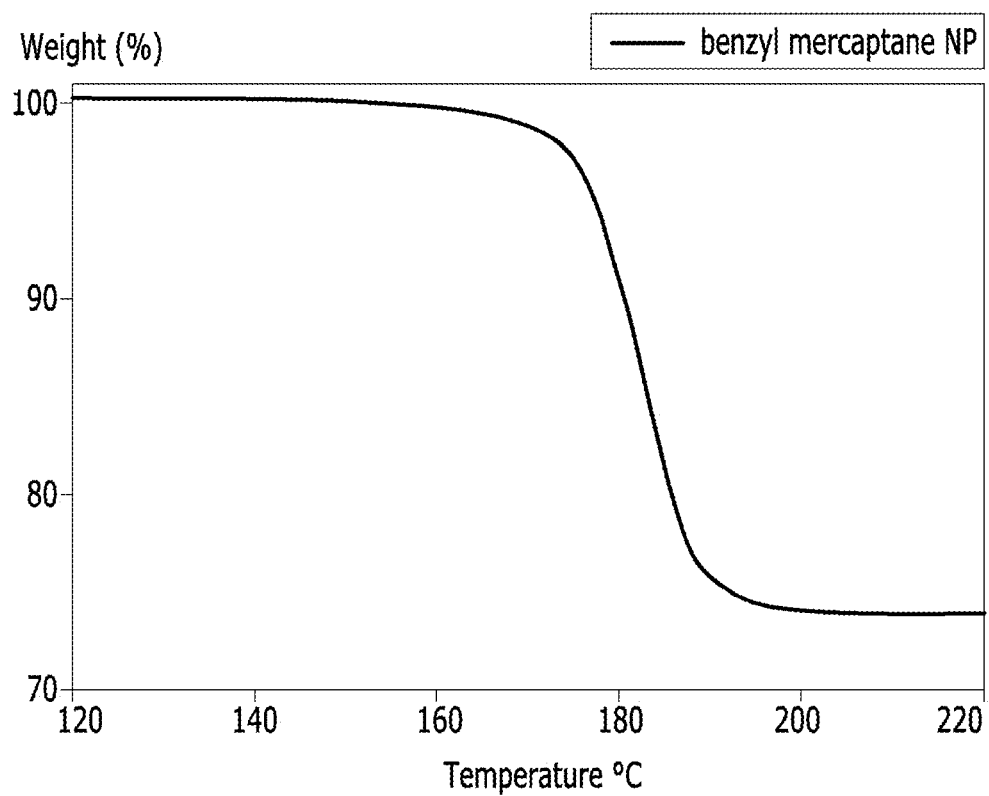
FIG. 7 is a graph of weight (percent, %) versus temperature (degrees Centigrade, ° C.) showing thermogravimetric analysis results of the nanoparticle according to Preparation Example 1.

[2] Thermogravimetric analysis of the synthesized silver nanoparticles is performed, and the results are provided in FIG. 7. The results confirm that the synthesized nanoparticles include greater than or equal to 15 wt % (about 20% or 25%) of an organic material (e.g., benzyl mercaptane).

Preparation Example 2

Preparation of Nanowire Dispersion

An aqueous dispersion of the silver nanowire (purchased from Cambrios Co., Ltd., Nanopyxis, Aiden, amount of the silver nanowire: 0.5 wt %, average diameter of the silver nanowire: 20-35 nm, average length of the silver nanowire: 15-30 micrometers (um) is prepared. A binder solution is prepared by dissolving 0.25 wt % of hydroxypropyl methyl cellulose (HPMC) in distilled water. The silver nanowire solution is mixed with the binder solution, and the resulting mixture is diluted with a mixed solution of water and ethanol in a volume ratio of 70:30 to have a concentration of 0.1 to 0.2 wt %, thus obtaining a nanowire aqueous dispersion. Herein, the added amount of the binder and the nanowire is controlled in such a way that the resulting dispersion has a weight ratio between binder/AgNW of 0.05 to 0.1 wt/wt %.

Example 1

An aqueous composition is prepared by adding the silver nanoparticles of Preparation Example 1 to the nanowire aqueous dispersion of Preparation Example 2 in an amount of 10 parts by weight of per 100 parts by weight of a nanowire.

The prepared aqueous composition is coated on a polyethylene terephthalate (PET) or polycarbonate (PC) substrate by using an automated bar coater (GBC-A4, GIST) to manufacture a film, and the film is dried first using hot air at 90° C. and then—oven-dried at 110° C.

The dried film is heat-treated at 183° C. for 10 minutes, thus obtaining a conductive thin film. Scanning electron microscope analysis of the film is performed before and after the heat treatment, and the results are provided in FIGS. 2A and 2B.

Figure 2A:
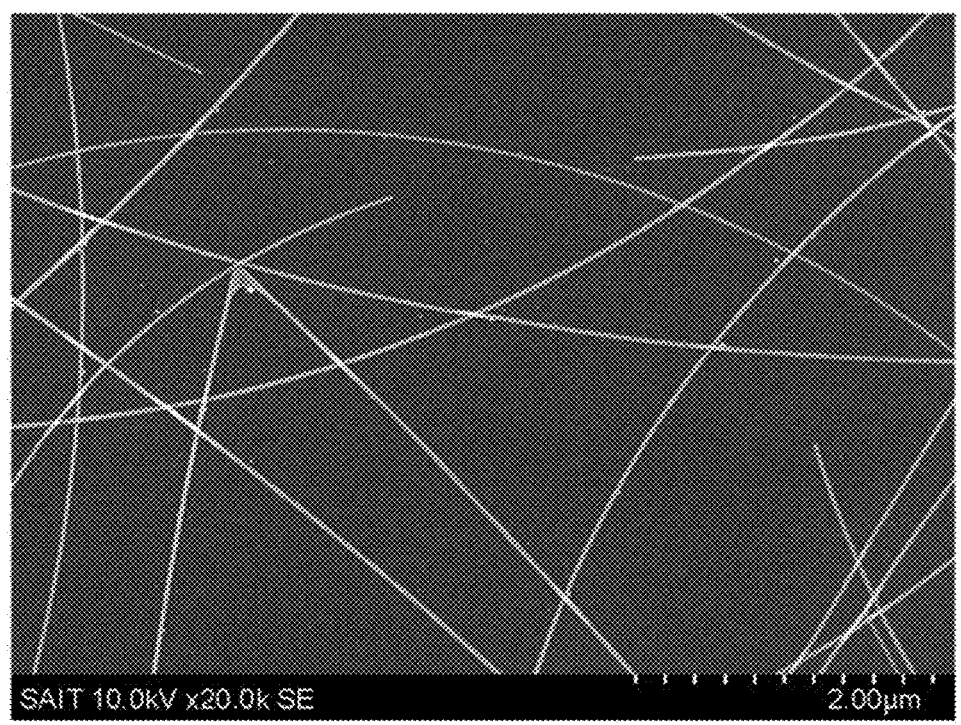
FIG. 2A shows a scanning electron microscopic (SEM) image of the film obtained from the aqueous composition of Example 1 before heat treatment.
Figure 2B:
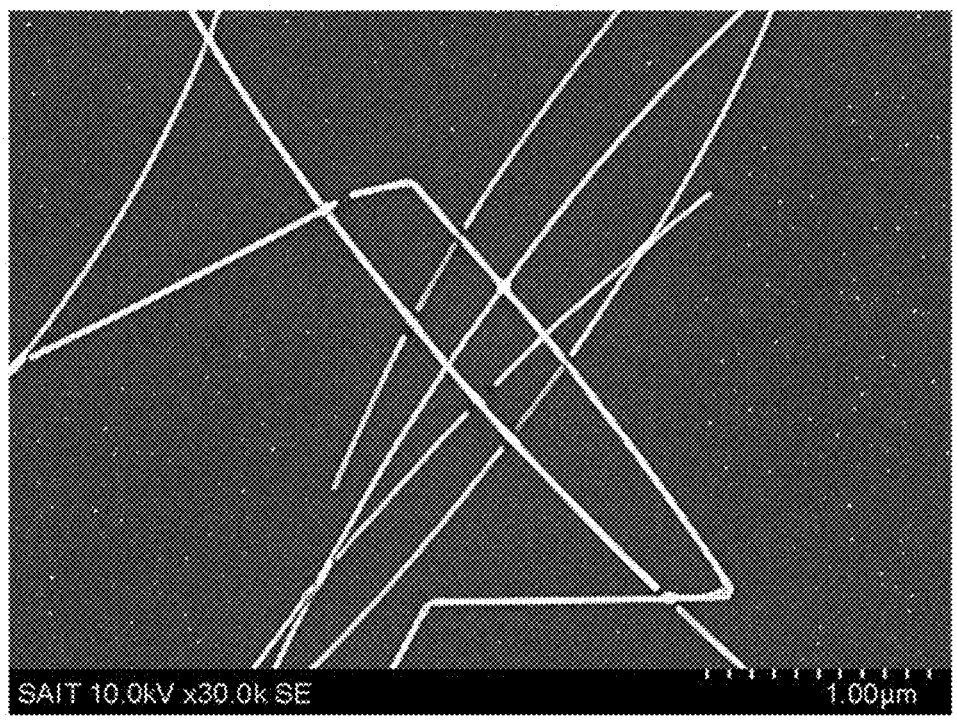
FIG. 2B shows a scanning electron microscope (SEM) image of the film obtained from the aqueous composition of Example 1 after heat treatment.

Referring to FIG. 2A, the nanoparticles are present adjacent to the nanowires in the film. Referring to FIG. 2B, the nanowires are junction-welded during the heat treatment.

Examples 2 to 7 and Comparative Examples 1 to 6

An aqueous composition is prepared by adding the silver nanoparticles of Preparation Example 1 to the nanowire aqueous dispersion of Preparation Example 2 in an amount ratio provided in the following Table 1.

TABLE 1

|  | BM-NP/Ag (wt/wt %) | NW concentration (wt/vol %) | Binder/Ag (wt/wt %, NW = 0.17 reference 0.063) |
|---|---|---|---|
| Comparative Example 1 | 0.0 | 0.12 | 0.088 |
| Comparative Example 2 | 0.0 | 0.17 | 0.063 |
| Comparative Example 3 | 0.0 | 0.18 | 0.059 |
| Comparative Example 4 | 0.0 | 0.19 | 0.056 |
| Comparative Example 5 | 0.0 | 0.20 | 0.053 |
| Comparative | 0.0 | 0.21 | 0.050 |

TABLE 1-continued

| | BM-NP/Ag (wt/wt %) | NW concentration (wt/vol %) | Binder/Ag (wt/wt %, NW = 0.17 reference 0.063) |
|---|---|---|---|
| Example 6 | | | |
| Example 2 | 10.0 | 0.12 | 0.088 |
| Example 3 | 10.0 | 0.17 | 0.063 |
| Example 4 | 10.0 | 0.18 | 0.059 |
| Example 5 | 10.0 | 0.19 | 0.056 |
| Example 6 | 10.0 | 0.20 | 0.053 |
| Example 7 | 10.0 | 0.21 | 0.050 |

The prepared aqueous composition is coated on a polyethylene terephthalate (PET) or polycarbonate (PC) substrate by using an automated bar coater (GBC-A4, GIST) to manufacture a film, and the film is dried first using hot air at 90° C. and then—oven-dried at 110° C.

Figure 3:
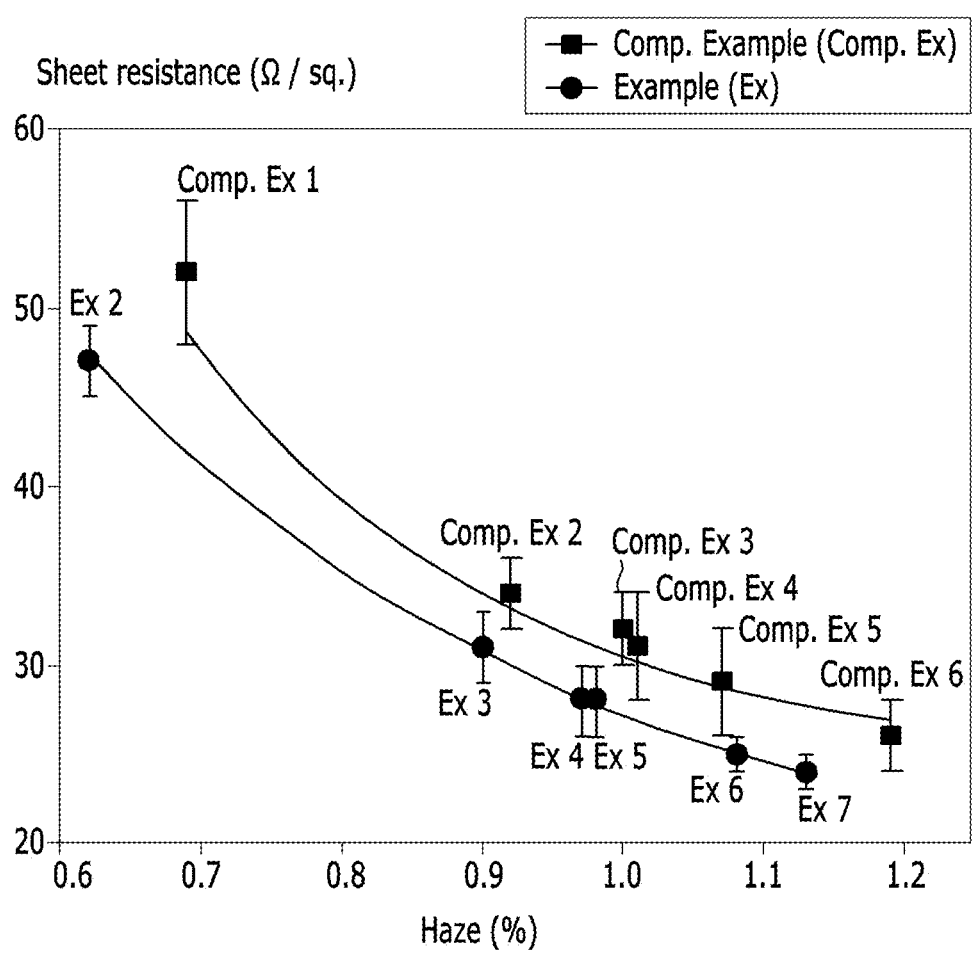
FIG. 3 is a graph of sheet resistance (ohms per square, Ω/sq) showing changes of haze and sheet resistance depending on an increase of a nanowire amount in the conductive films according to Examples 2 to 7 and Comparative Examples 1 to 6.

The dried film is heat-treated at 164° C. for 10 minutes under an air atmosphere or a nitrogen atmosphere, the sheet resistance, transmittance, and haze of the obtained thin film are measured, and the results are provided in FIG. 3.

The sheet resistance of the manufactured nanowire conductive film is measured by using R-Chek, a 4-point sheet resistance measuring system. The sheet resistance of the film is measured by averaging sheet resistances at 24 points of an A4-sized sheet of paper. The transmittance and haze characteristics of the conductive film are measured by using a haze meter (NDH-7000SP, Nippon Denshokku).

Referring to the results of FIG. 3, the conductive films including 10% of the silver nanoparticles of Preparation Example 1 according to the examples show lower sheet resistance than the conductive films of the comparative examples at similar haze.

Examples 8 to 11

The silver nanoparticles according to Preparation Example 1 are added to the nanowire aqueous dispersion according to Preparation Example 2 in an amount ratio provided in Table 2 to prepare an aqueous composition:

TABLE 2

| | BM-NP/Ag (wt/wt %) | NW concentration (wt/vol %) | Binder/Ag (wt/wt %, reference NW = 0.17, 0.063) |
|---|---|---|---|
| Comparative Example 4 | 0% | 0.19 | 0.056 |
| Example 8 | 5% | 0.19 | 0.056 |
| Example 9 | 10% | 0.19 | 0.056 |
| Example 10 | 20% | 0.19 | 0.056 |
| Example 11 | 30% | 0.19 | 0.056 |

The prepared aqueous composition is coated on a polyethylene terephthalate (PET) or polycarbonate (PC) substrate using an automated bar coater (GBC-A4, GIST) to manufacture a film, and the film is first dried using hot air at 90° C. and then—oven-dried at 110° C.

The dried film is heat-treated at a temperature of 164° C. for 10 minutes under an air or nitrogen atmosphere. Then, a UV curable resin is coated to form a thin overcoating layer on the surface of the conductive film obtained by the aforementioned method. The sheet resistance, transmittance, and haze of the obtained thin film are measured by the above method, and the results are provided in FIG. 4.

Figure 4:
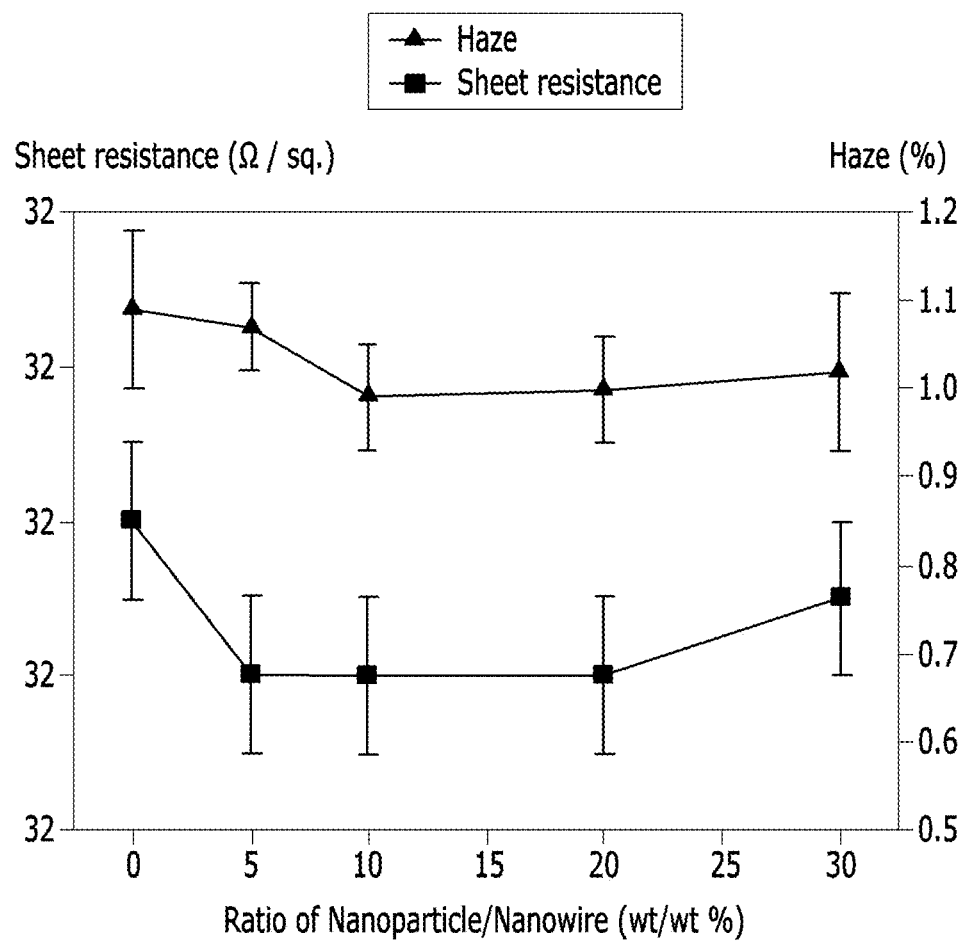
FIG. 4 is a graph of sheet resistance (ohms per square, Ω/sq) and haze (percent) versus ratio of a nanoparticle to a nanowire (weight to weight percent, wt/wt %) showing sheet resistance and haze of the conductive film prepared in Examples 8 to 11 and Comparative Example 7.

Referring to the results of FIG. 4, the conductive film having the overcoating layer according to exemplary embodiments may show lower sheet resistance (e.g., 26 ohm/sq) and low haze. In particular, when nanoparticles are added, not only the sheet resistance but also the haze may be sharply decreased.

Example 12

The silver nanoparticles of Preparation Example 1 are added to the nanowire aqueous dispersion of Preparation Example 2 in such an amount that the resulting aqueous composition has a nanoparticle/nanowire ratio of 1.5 weight to weight percent (wt/wt %). In the composition, the nanowire concentration is 0.21 weight to volume percent (wt/vol %) and the binder is included in a ratio of binder/Ag nanowire (wt/wt %) of 0.050.

The prepared aqueous composition is coated on a polyethylene terephthalate (PET) or polycarbonate (PC) substrate by using an automated bar coater (GBC-A4, GIST) to manufacture a film, and the film is first dried using hot air at 90° C. and then—oven-dried at 110° C.

The dried film is heat-treated at 164° C. for 10 minutes under an air or nitrogen atmosphere. The sheet resistance, transmittance, and haze of the manufactured thin film are measured by the above method. As a result, the sheet resistance is 24 ohm/sq after the heat treatment, the sheet resistance decrease ratio is 14.3% with respect to the sheet resistance before the heat treatment, the transmittance is 87.94%, and the haze is 1.12%.

Comparative Example 7

A thin film is manufactured according to the same method as Example 12, except for adding silver nanoparticles (having $NaBH_4$ on their surface) (average particle size: 12 nm) to the nanowire aqueous dispersion of Preparation Example 2 with a concentration between nanoparticle/nanowire of 1.5 wt/wt %, and sheet resistance, transmittance, and haze of the thin film are measured by the above method. As a result, the thin film has sheet resistance of 26 ohm/sq after the heat treatment, a sheet resistance decrease ratio of 3.7% relative to the sheet resistance before the heat treatment, transmittance of 87.62%, and haze of 1.21%. The results confirm that the thin film of Comparative Example 7 has very small decrease rate of sheet resistance in comparison with the thin film of Example 12. In addition, the thin film of Comparative Example 7 has remarkably poor transmittance even when a small amount of the nanoparticles are used.

Comparative Example 8

A thin film is prepared in the same manner as set forth in Example 12, except that (citrate-stabilized) silver nanoparticles (average particle size: about 10 nm, purchased from Sigma-Aldrich Co., Ltd.) are added to the nanowire aqueous dispersion of Preparation Example 2 in such an amount that the ratio of nanoparticle/nanowire is 0.3 wt/wt %. For the thin film thus prepared, the sheet resistance, transmittance, and haze are measured by the foregoing method. As a result, the film has sheet resistance of 27 ohm/sq after the heat treatment, a sheet resistance decrease ratio of 6.9% relative to the sheet resistance before the heat treatment, transmittance of 87.78%, and haze of 1.18%. These results confirm that the thin film of Comparative Example 8 has very small decrease rate of sheet resistance in comparison with the thin film of Example 12. In addition, the thin film of Comparative Example 8 has remarkably poor transmittance even when a small amount of the nanoparticles are used.

While this disclosure has been described in connection with what is presently considered to be practical exemplary embodiments, it is to be understood that the present inventive concept is not limited to the disclosed embodiments, but, on the contrary, is intended to cover various modifications and equivalent arrangements included within the spirit and scope of the appended claims.

What is claimed is:

1. An aqueous composition, comprising:
a conductive metal nanoparticle comprising a C6 to C30 aromatic monothiol compound disposed on a surface of the conductive metal nanoparticle;
a conductive metal nanowire; and
a solvent comprising water and optionally an alcohol.

2. The aqueous composition of claim 1, wherein the conductive metal nanoparticle has an average diameter of less than or equal to about 5 nanometers, and the conductive metal nanowire has a diameter of less than or equal to about 50 nanometers.

3. The aqueous composition of claim 1, wherein the conductive metal nanowire has a length of greater than or equal to about 10 micrometers.

4. The aqueous composition of claim 1,
wherein the conductive metal nanoparticle comprises silver, gold, aluminum, copper, tin, palladium, platinum, tungsten, molybdenum, or a combination thereof, and
wherein the conductive metal nanowire comprises silver, copper, gold, aluminum, cobalt, palladium, or a combination thereof.

5. The aqueous composition of claim 1, wherein the conductive metal nanoparticle and the conductive metal nanowire comprise the same metal.

6. The aqueous composition of claim 1, wherein the conductive metal nanoparticle further comprises a C2 to C30 aliphatic thiol compound, a C2 to C30 carboxylic acid compound, a C2 to C30 amine compound, or a combination thereof disposed on a surface of the conductive metal nanoparticle.

7. The aqueous composition of claim 1, wherein an amount of the conductive metal nanoparticle is about 1 to about 50 parts by weight per 100 parts by weight of the conductive metal nanowire.

8. The aqueous composition of claim 1, wherein an amount of the C6 to C30 aromatic monothiol compound disposed on a surface of the conductive metal nanoparticle is less than or equal to about 50% based on the total weight of the conductive metal nanoparticle.

9. The aqueous composition of claim 1, wherein the alcohol comprises 1 to 10 carbon atoms and 1 to 6 hydroxy group.

10. A method of producing a conductive thin film, comprising:
obtaining an aqueous dispersion comprising a binder and a conductive metal nanowire having a diameter of less than or equal to about 50 nm;
mixing the aqueous dispersion with a conductive metal nanoparticle comprising a C6 to C30 aromatic monothiol organic compound disposed on the surface of the conductive metal nanoparticle, wherein an average particle diameter of the conductive metal nanoparticle is less than or equal to about 5 nanometers to obtain an aqueous composition;
coating the aqueous composition on a substrate, and optionally drying the same to obtain a film; and
heat-treating the film at a temperature of greater than or equal to about 80° C. and less than or equal to about 190° C., to prepare a conductive thin film comprising at least two conductive metal nanowires welded by the conductive metal nanoparticle,
wherein the aqueous composition comprises a solvent comprising water and optionally an alcohol.

11. The method of claim 10, wherein the conductive metal nanoparticle comprises silver, gold, aluminum, copper, tin, palladium, platinum, tungsten, molybdenum, or a combination thereof, and
the conductive metal nanowire comprises silver, copper, gold, aluminum, cobalt, palladium, or a combination thereof.

12. The method of claim 10, wherein the conductive metal nanoparticle further comprises a C2 to C30 aliphatic thiol compound, a C2 to C30 carboxylic acid compound, a C2 to C30 amine compound, or a combination thereof disposed on a surface of the conductive metal nanoparticle.

13. A conductive thin film comprising at least two conductive metal nanowires welded by at least a portion of a conductive metal nanoparticle comprising a C6 to C30 aromatic monothiol compound disposed on a surface of the conductive metal nanoparticle, wherein the conductive metal nanoparticle has an average particle diameter of less than or equal to about 5 nanometers.

14. The conductive thin film of claim 13, wherein the conductive metal nanowire has a diameter of less than or equal to about 50 nanometers.

15. The conductive thin film of claim 13, wherein the conductive metal nanoparticle comprises silver, gold, aluminum, copper, tin, palladium, platinum, tungsten, molybdenum, or a combination thereof, and
the conductive metal nanowire comprises silver, copper, gold, aluminum, cobalt, palladium, or a combination thereof.

16. The conductive thin film of claim 13, wherein the conductive metal nanoparticle and the conductive metal nanowire comprises the same metal.

17. The conductive thin film of claim 13, wherein the conductive metal nanoparticle further comprises a C2 to C30 aliphatic thiol compound, a C2 to C30 carboxylic acid compound, a C2 to C30 amine compound, or a combination thereof disposed on a surface of the conductive metal nanoparticle.

18. The conductive thin film of claim 13, which further comprises an overcoating layer comprising a thermosetting resin, an ultraviolet curable resin, or a combination thereof on the surface of the thin film.

19. The conductive thin film of claim 13, which has sheet resistance of less than or equal to about 50 ohms per square, and transmittance of greater than or equal to 90% in a full visible light range of 380 nanometers to 780 nanometers at haze of less than or equal to about 1.0% measured by a haze meter.

20. The conductive thin film of claim 19, which has sheet resistance of less than or equal to about 40 ohms per square, and transmittance of greater than or equal to 90% in a full visible light range of 380 nanometers to 780 nanometers at haze of less than or equal to about 1.0% measured by a haze meter.

21. An electronic device comprising the conductive thin film of claim 13.

22. The electronic device of claim 21, wherein the electronic device is a display, a touch screen panel, a solar cell, an e-window, an electrochromic mirror, a transparent heater, a heat mirror, a transparent transistor, a transparent strain sensor, or a flexible display.

* * * * *